(12) United States Patent
Jang et al.

(10) Patent No.: US 12,144,214 B2
(45) Date of Patent: Nov. 12, 2024

(54) LIGHT EMITTING DISPLAY PANEL AND LIGHT EMITTING DISPLAY APPARATUS INCLUDING THE SAME

(71) Applicant: LG DISPLAY CO., LTD., Seoul (KR)

(72) Inventors: YoungIn Jang, Paju-si (KR); Ji-Heun Lee, Paju-si (KR); EunJi Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 439 days.

(21) Appl. No.: 17/470,510

(22) Filed: Sep. 9, 2021

(65) Prior Publication Data

US 2022/0102471 A1 Mar. 31, 2022

(30) Foreign Application Priority Data

Sep. 28, 2020 (KR) .................. 10-2020-0126091

(51) Int. Cl.
*H10K 59/131* (2023.01)
*G09G 3/3291* (2016.01)
*H10K 59/122* (2023.01)

(52) U.S. Cl.
CPC ......... *H10K 59/131* (2023.02); *G09G 3/3291* (2013.01); *H10K 59/122* (2023.02)

(58) Field of Classification Search
CPC ............... H10K 59/131; H10K 59/122; H10K 59/80522; H10K 59/80516; H10K 59/1213; H10K 59/121; H10K 59/124; G09G 3/3291; G09G 3/3258
See application file for complete search history.

(56) References Cited

U.S. PATENT DOCUMENTS

| | | | |
|---|---|---|---|
| 2006/0123293 A1 | 6/2006 | Kim et al. | |
| 2016/0149155 A1* | 5/2016 | Kim | H10K 59/122 |
| | | | 438/23 |
| 2016/0293888 A1* | 10/2016 | Shim | H10K 59/124 |
| 2016/0351638 A1* | 12/2016 | Im | H10K 50/84 |
| 2017/0062755 A1* | 3/2017 | Im | H10K 50/828 |
| 2018/0097047 A1* | 4/2018 | Jung | H10K 59/122 |
| 2018/0120620 A1* | 5/2018 | Shim | H10K 59/122 |
| 2018/0123078 A1* | 5/2018 | Byun | H10K 59/1213 |
| 2018/0151647 A1* | 5/2018 | Lee | H10K 59/12 |
| 2018/0151831 A1* | 5/2018 | Lee | H10K 50/844 |

(Continued)

OTHER PUBLICATIONS

German Office Action dated Jul. 8, 2024 issued in Patent Application No. 10 2021 123 359.3 (10 pages) (10 pages).

*Primary Examiner* — Bitew A Dinke
(74) *Attorney, Agent, or Firm* — POLSINELLI PC

(57) ABSTRACT

A light emitting display panel and a light emitting display apparatus including the same, in which a cathode is connected to an auxiliary cathode electrode through an undercut region provided under a planarization layer, are provided. The light emitting display panel includes a substrate, an auxiliary cathode electrode provided in the substrate, a passivation layer covering the auxiliary cathode electrode, an anode provided on the passivation layer, a bank surrounding an outer portion of the anode, a light emitting layer provided on the anode, and a cathode provided on the light emitting layer, the cathode is connected to the auxiliary cathode electrode through a connection electrode exposed at an undercut region passing through the bank and the passivation layer.

17 Claims, 13 Drawing Sheets

(56) References Cited

U.S. PATENT DOCUMENTS

| | | | |
|---|---|---|---|
| 2018/0190934 A1* | 7/2018 | Choi | H10K 50/824 |
| 2019/0115403 A1* | 4/2019 | Kang | H10K 50/84 |
| 2019/0165305 A1* | 5/2019 | Zhang | H10K 59/80521 |
| 2019/0172898 A1* | 6/2019 | Choi | H10K 50/822 |
| 2020/0135838 A1* | 4/2020 | Han | H10K 59/127 |
| 2020/0203469 A1* | 6/2020 | Li | H10K 59/1315 |
| 2020/0328376 A1* | 10/2020 | Seo | H10K 59/122 |
| 2021/0066418 A1* | 3/2021 | Seo | H10K 71/00 |
| 2023/0059042 A1* | 2/2023 | Lee | H10K 59/12 |
| 2023/0354637 A1* | 11/2023 | Kim | H10K 59/124 |

\* cited by examiner

LIGHT EMITTING DISPLAY PANEL AND LIGHT EMITTING DISPLAY APPARATUS INCLUDING THE SAME

CROSS-REFERENCE TO RELATED APPLICATION

This application claims the benefit of the Korean Patent Application No. 10-2020-0126091 filed on Sep. 28, 2020, which is hereby incorporated by reference in its entirety as if fully set forth herein.

BACKGROUND

Field of the Disclosure

The present disclosure relates to a light emitting display panel and a light emitting display apparatus including the same.

Description of the Background

Light emitting display apparatuses are display apparatuses which emit light by using a light emitting device and include a light emitting display panel including a plurality of light emitting devices.

The light emitting device emits light by using a voltage supplied to a cathode and an anode thereof. Particularly, a cathode voltage supplied to the cathode is applied to all pixels in common.

However, as the light emitting display panel is progressively enlarged in size, the cathode voltage is differently shifted at each position of the light emitting display panel, and due to this, the quality of the light emitting display panel is degraded.

SUMMARY

Accordingly, the present disclosure provides a light emitting display panel and a light emitting display apparatus including the same that substantially obviate one or more problems due to limitations and disadvantages of the background art.

More specifically, the present disclosure provides a light emitting display panel and a light emitting display apparatus including the same, in which a cathode is connected to an auxiliary cathode electrode through an undercut region provided under a planarization layer.

Additional advantages and features of the disclosure will be set forth in part in the description which follows and in part will become apparent to those having ordinary skill in the art upon examination of the following or may be learned from practice of the disclosure. The other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display panel including a substrate, an auxiliary cathode electrode provided in the substrate, a passivation layer covering the auxiliary cathode electrode, an anode provided on the passivation layer, a bank surrounding an outer portion of the anode, a light emitting layer provided on the anode, and a cathode provided on the light emitting layer, the cathode is connected to the auxiliary cathode electrode through a connection electrode exposed at an undercut region passing through the bank and the passivation layer.

In another aspect of the present disclosure, there is provided a light emitting display panel including a substrate, an auxiliary cathode electrode provided in the substrate, a buffer covering the auxiliary cathode electrode, a pixel driving circuit layer provided in the buffer, the pixel driving circuit layer including a driving transistor, an insulation layer covering the pixel driving circuit layer, a planarization layer covering the insulation layer and planarizing an upper end of the insulation layer, an anode provided in the planarization layer and connected to the driving transistor, a bank surrounding an outer portion of the anode, a light emitting layer provided on the anode, and a cathode provided on the light emitting layer, wherein the cathode is connected to the auxiliary cathode electrode through a connection electrode exposed at an undercut region passing through the bank, the planarization layer, the insulation layer, and the buffer.

In another aspect of the present disclosure, there is provided a light emitting display apparatus including the light emitting display panel, a data driver supplying data voltages to a plurality of data lines included in the light emitting display panel, a gate driver supplying gate voltages to a plurality of gate lines included in the light emitting display panel, and a controller controlling the data driver and the gate driver.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
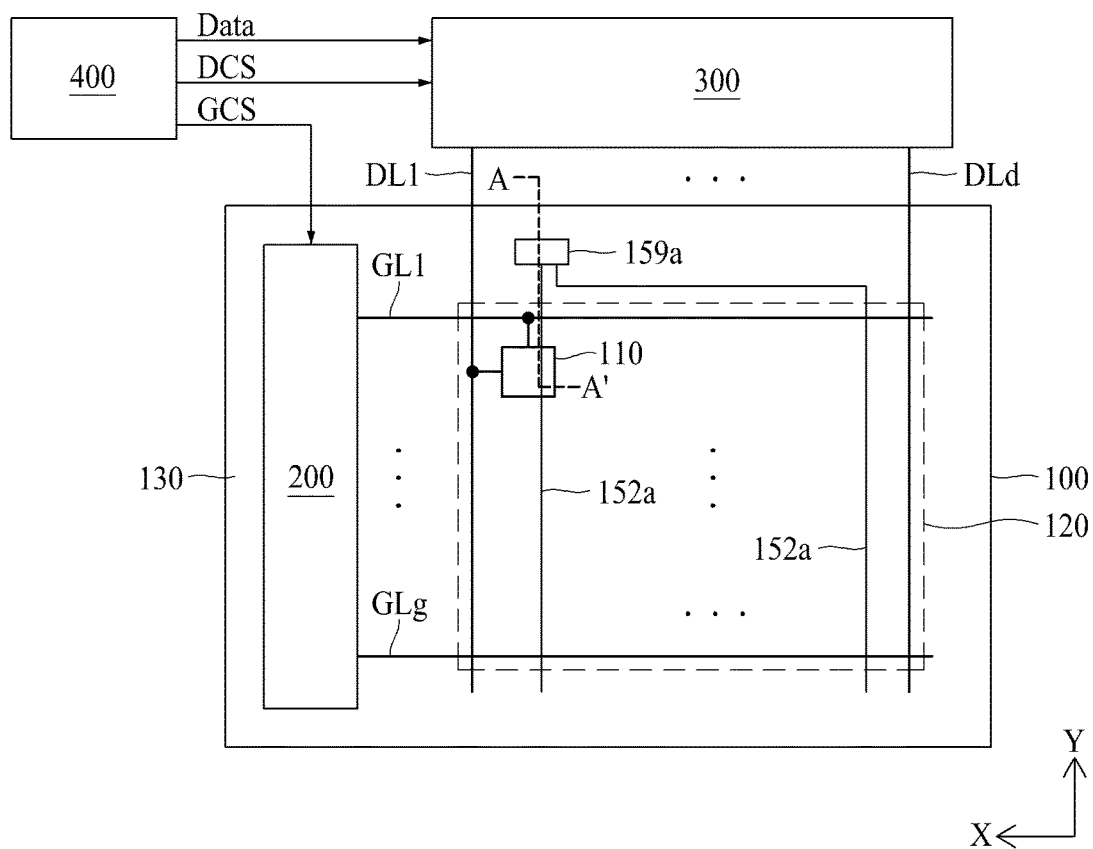
FIG. 1 is an exemplary diagram illustrating a configuration of a light emitting display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
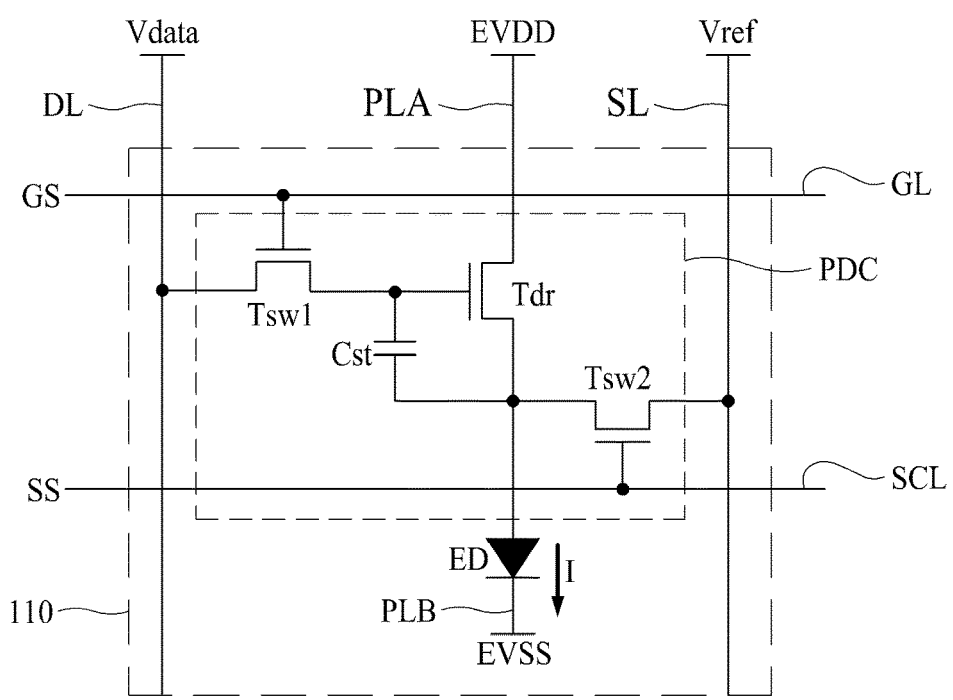
FIG. 2 is an exemplary diagram illustrating a structure of a pixel applied to a light emitting display apparatus according to an aspect of the present disclosure.

FIG. 1 is an exemplary diagram illustrating a configuration of a light emitting display apparatus according to an aspect of the present disclosure. FIG. 2 is an exemplary diagram illustrating a structure of a pixel applied to a light emitting display apparatus according to an aspect of the present disclosure.

The light emitting display apparatus according to an aspect of the present disclosure may configure various kinds of electronic devices. The electronic devices may include, for example, smartphones, tablet personal computers (PCs), televisions (TVs), and monitors.

The light emitting display apparatus according to an aspect of the present disclosure, as illustrated in FIG. 1, may include a light emitting display panel 100 which includes a display area 120 displaying an image and a non-display area 130 provided outside the display area 120, a gate driver 200 which supplies a gate signal to a plurality of gate lines GL1 to GLg included in the display area 120 of the light emitting display panel 100, a data driver 300 which supplies data voltages to a plurality of data lines DL1 to DLd included in the light emitting display panel 100, and a controller 400 which controls driving of the gate driver 200 and the data driver 300.

First, the light emitting display panel 100 may include the display area 120 and the non-display area 130. The plurality of gate lines GL1 to GLg, the plurality of data lines DL1 to DLd, and a plurality of pixels 110 may be provided in the display area 120.

For example, as illustrated in FIG. 2, the pixel 110 included in the light emitting display panel 100 may include a light emitting device ED, a switching transistor Tsw1, a storage capacitor Cst, a driving transistor Tdr, and a sensing transistor Tsw2. That is, the pixel 110 may include a pixel driving circuit PDC and a light emitting unit, and the pixel driving circuit PDC may include the switching transistor Tsw1, the storage capacitor Cst, the driving transistor Tdr, and the sensing transistor Tsw2, and the light emitting unit may include the light emitting device ED.

The brightness of light may be controlled based on a level of a current I flowing in the light emitting device ED, and a level of the current I flowing in the light emitting device ED may be controlled by the driving transistor Tdr. The driving transistor Tdr may be controlled by a data voltage Vdata.

The light emitting device ED may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

Moreover, the light emitting device ED may emit light corresponding to one of various colors such as red, green, and blue, or may emit white light.

The switching transistor Tsw1 configuring the pixel driving circuit PDC may be turned on or off based on a gate signal GS supplied through a gate line GL, and when the switching transistor Tsw1 is turned on, the data voltage Vdata supplied through the data line DL may be supplied to the driving transistor Tdr. A first voltage EVDD may be supplied to the driving transistor Tdr and the light emitting device ED through a first voltage supply line PLA, and a second voltage EVSS may be supplied to the light emitting device ED through a second voltage supply line PLB. The sensing transistor Tsw2 may be turned on or off based on a sensing control signal SS supplied through a sensing control line SCL, and the sensing control line SCL may be connected to the sensing transistor Tsw2. A reference voltage Vref may be supplied to the pixel 110 through a sensing line SL, and a sensing signal associated with a characteristic change of the driving transistor Tdr may be transferred to the sensing line SL through the sensing transistor Tsw2.

The pixel 110 applied to the present disclosure may be formed in a structure illustrated in FIG. 2, but the present disclosure is not limited thereto. Therefore, a pixel applied to the present disclosure may be modified as various types in addition to the structure illustrated in FIG. 2.

In the light emitting display panel 100, a plurality of pixel areas including the pixels 110 may be formed, and a plurality of signal lines for supplying various signals to the pixel driving circuit PDC included in the pixel 110 may be formed.

For example, in the light emitting display panel including the pixel 110 as illustrated in FIG. 2, the signal lines may include the gate line GL, the data line DL, the sensing control line SCL, the first voltage supply line PLA, the second voltage supply line PLB, and the sensing line SL.

The data driver 300 may be provided on a chip-on film (COF) attached on the light emitting display panel 100 and may be connected to a main substrate including the controller 400. In this case, the COF may include a plurality of lines which electrically connect the controller 400, the data driver 300, and the light emitting display panel 100, and to this end, the lines may electrically connect the main substrate to a plurality of pads included in the light emitting display panel 100. The main substrate may be electrically connected to an external substrate with an external system mounted thereon.

The data driver 300 may be directly mounted on the light emitting display panel 100, and then, may be electrically connected to the main substrate.

However, the data driver 300 may be implemented as one integrated circuit (IC) along with the controller 400, and the IC may be provided on the COF or may be directly mounted on the light emitting display panel 100.

The data driver 300 may receive a sensing signal, associated with a characteristic change of the light emitting device ED included in the light emitting display panel 100, from the light emitting display panel 100 and may transfer the sensing signal to the controller 400.

The gate driver 200 may be configured as an IC and may be mounted in the non-display area 130, or may be directly embedded into the non-display area 130 by using a gate in panel (GIP) type. In a case which uses the GIP type, a plurality of transistors configuring the gate driver 200 may be provided in the non-display area 130 through the same process as transistors included in each of the pixels 110 of the display area 120.

When a gate pulse generated by the gate driver 200 is supplied to a gate of the switching transistor Tsw1 included in the pixel 110, the switching transistor Tsw1 may be turned on, and thus, light may be emitted from the pixel 110. When a gate-off signal is supplied to the switching transistor Tsw1, the switching transistor Tsw1 may be turned off, and thus, light may not be emitted from the pixel 110. The gate signal GS supplied through the gate line GL may include the gate pulse and the gate-off signal.

The controller 400 may include a data aligner which realigns pieces of input video data transmitted from the external system by using a timing synchronization signal transmitted from the external system to supply pieces of realigned image data to the data driver 300, a control signal generator which generates a gate control signal GCS and a data control signal DCS by using the timing synchronization signal, an input unit which receives the timing synchronization signal and the pieces of input video data transmitted from the external system and transfers the timing synchronization signal and the pieces of input video data to the data aligner and the control signal generator, and an output unit which outputs, to the data driver 300 or the gate driver 200, the pieces of image data generated by the data aligner and the control signals GCS and DCS generated by the control signal generator.

The controller 400 may further perform a function of analyzing touch sensing signals received through a touch panel embedded into or attached on the light emitting display panel 100 to sense the occurrence or not of a touch and a touch position.

The external system may perform a function of driving the controller 400 and an electronic device. That is, when the electronic device is a smartphone, the external system may receive various sound information, image information, and letter information over a wireless communication network and may transfer the received image information to the controller 400. The image information may include the pieces of input video information.

Hereinafter, a light emitting display panel having a pixel structure illustrated in FIG. 2 among various types of light emitting display panels will be described as an example of a light emitting display panel according to an aspect of the present disclosure.

Figure 3:
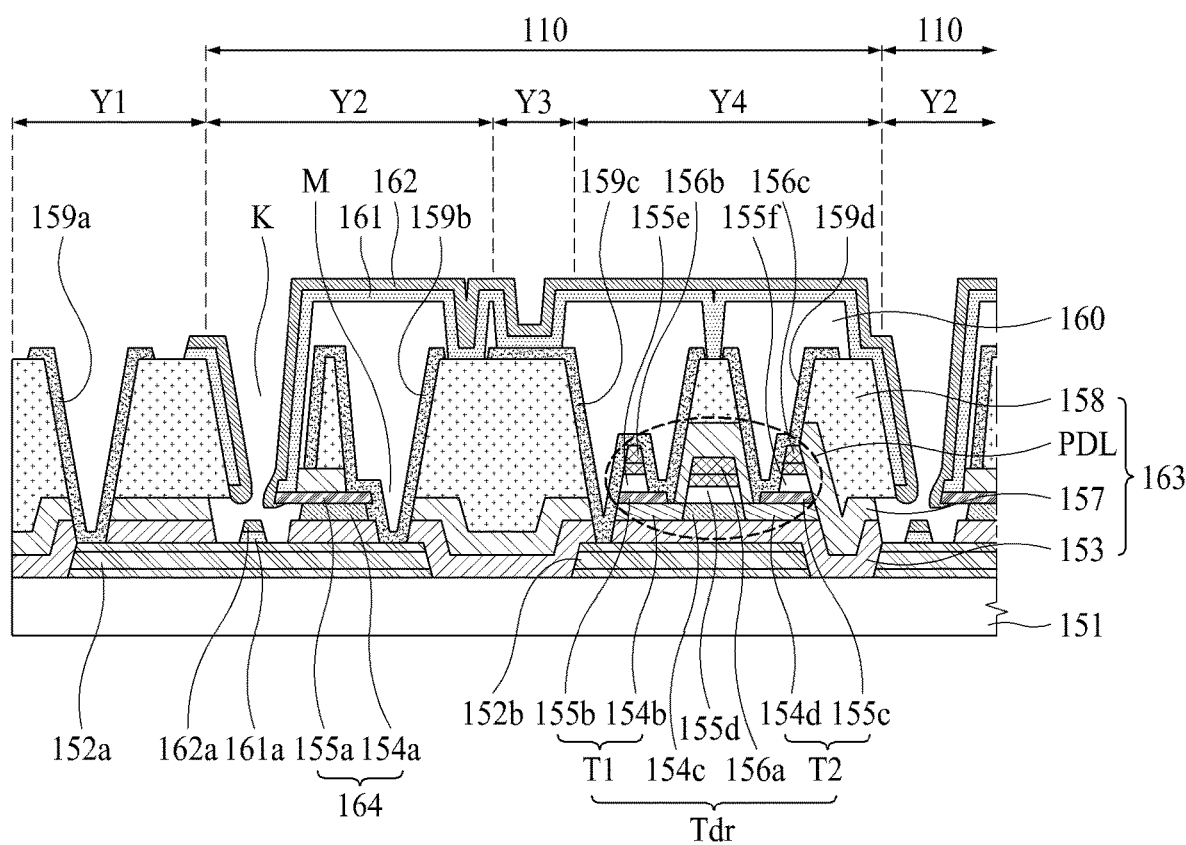
FIG. 3 is an exemplary diagram illustrating a cross-sectional surface of a light emitting display panel according to an aspect of the present disclosure.
Figure 4:
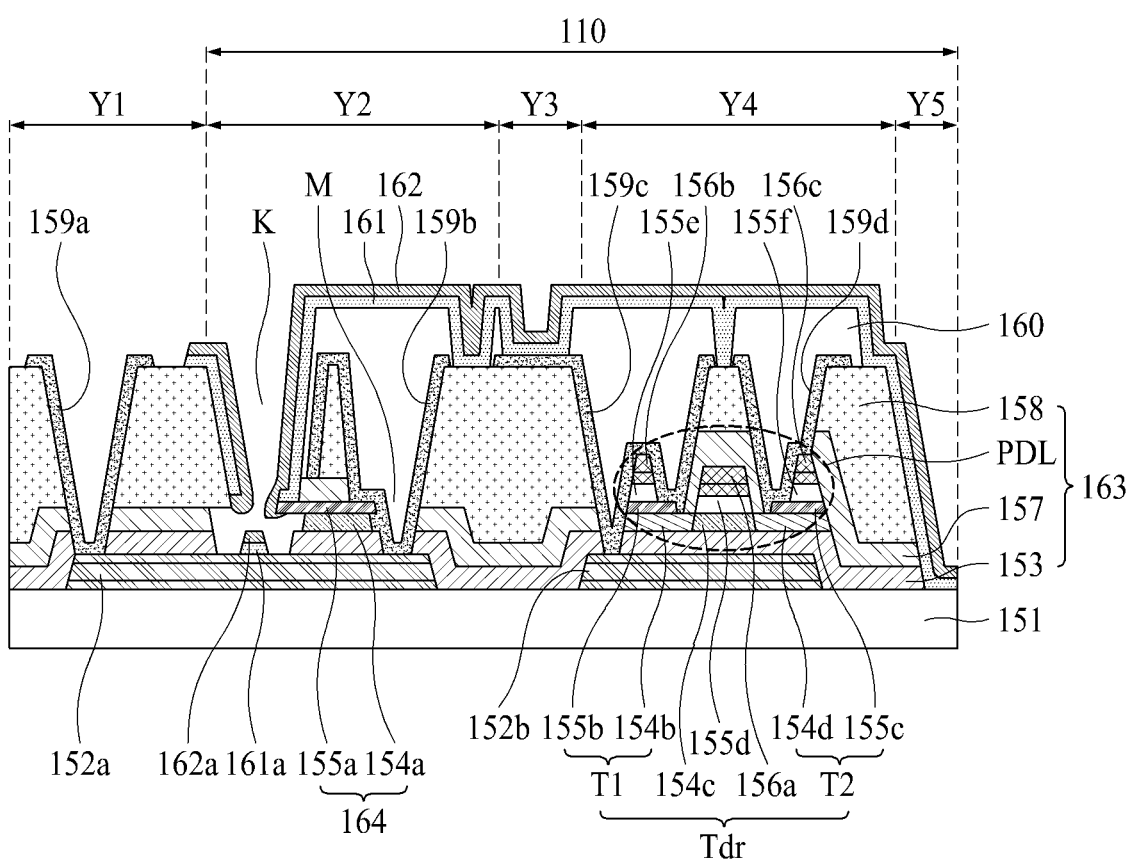
FIG. 4 is another exemplary diagram illustrating a cross-sectional surface of a light emitting display panel according to an aspect of the present disclosure.
Figure 5:
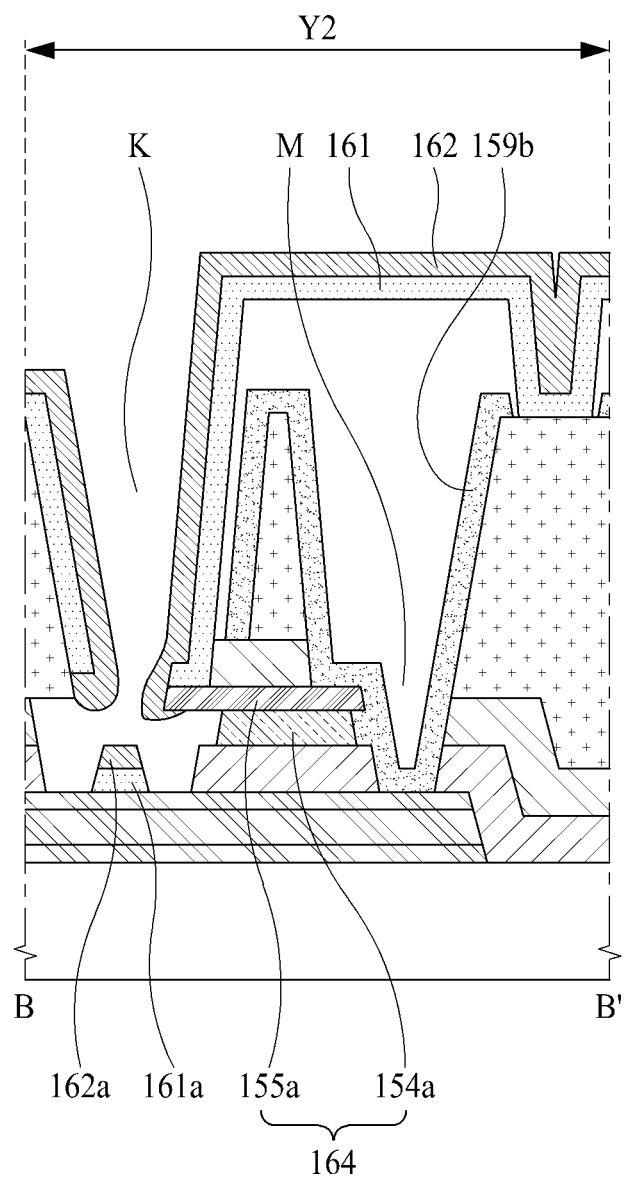
FIG. 5 is a cross-sectional view illustrating an undercut portion Y2 illustrated in FIGS. 3 and 4.
Figure 6:
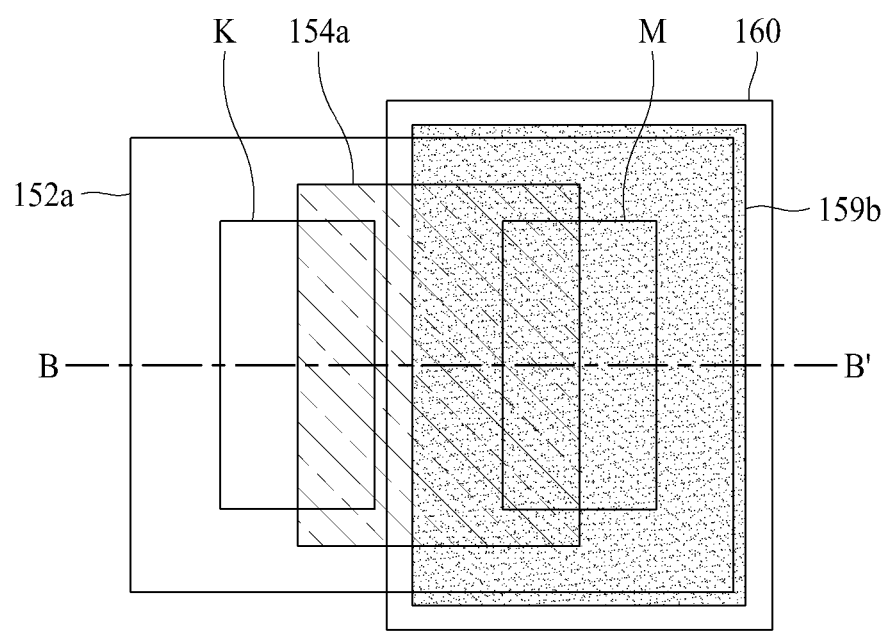
FIG. 6 is a plan view corresponding to the undercut portion Y2 illustrated in FIGS. 3 and 4.
Figure 7:
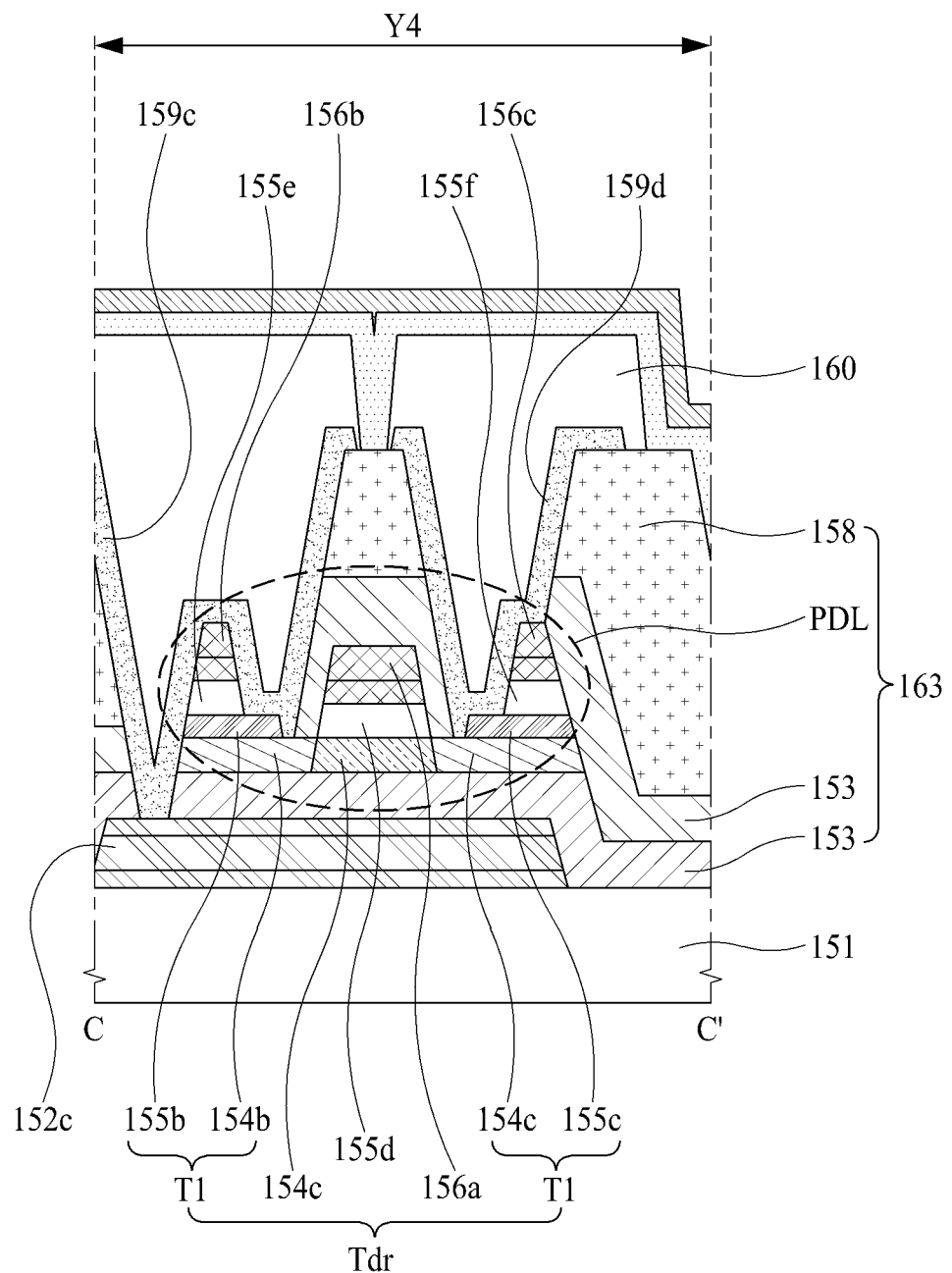
FIG. 7 is a cross-sectional view illustrating a blocking portion Y4 illustrated in FIGS. 3 and 4.
Figure 8:
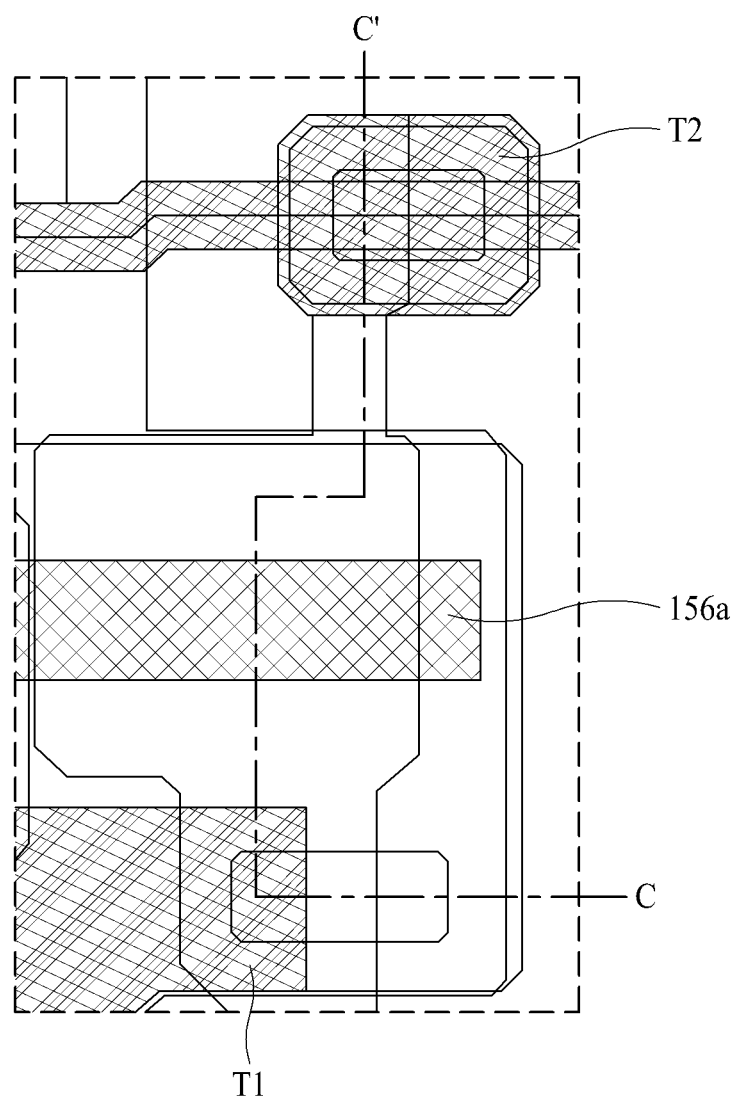
FIG. 8 is a plan view corresponding to the blocking portion Y4 illustrated in FIGS. 3 and 4.

FIG. 3 is an exemplary diagram illustrating a cross-sectional surface of a light emitting display panel according to an aspect of the present disclosure, FIG. 4 is another exemplary diagram illustrating a cross-sectional surface of a light emitting display panel according to an aspect of the present disclosure, FIG. 5 is a cross-sectional view illustrating an undercut portion Y2 illustrated in FIGS. 3 and 4, FIG. 6 is a plan view corresponding to the undercut portion Y2 illustrated in FIGS. 3 and 4, FIG. 7 is a cross-sectional view illustrating a blocking portion Y4 illustrated in FIGS. 3 and 4, and FIG. 8 is a plan view corresponding to the blocking portion Y4 illustrated in FIGS. 3 and 4. Particularly, FIGS. 3 and 4 are exemplary diagrams illustrating a cross-sectional surface taken along line A-A' illustrated in FIG. 1.

The light emitting display panel according to the present disclosure, as illustrated in FIGS. 3 to 7, may include a substrate 151, an auxiliary cathode electrode 152a included in the substrate 151, a passivation layer 163 covering the auxiliary cathode electrode 152a, an anode 159c provided on the passivation layer 163, a bank 160 surrounding an outer portion of the anode 159c, a light emitting layer 161 provided on the anode 159c, and the cathode 162 provided on the light emitting layer 161. Particularly, the cathode 162 may be connected to the auxiliary cathode electrode 152a through the connection electrode 164 exposed at the undercut region K passing through the bank 160 and the passivation layer 163.

The passivation layer 163 may include a buffer 153 which covers the auxiliary cathode electrode 152a, a pixel driving circuit layer PDL which is provided in the buffer 153 and includes a driving transistor Tdr connected to the anode, an insulation layer 157 which covers the pixel driving circuit layer PDL, and a planarization layer 158 which covers the insulation layer 157 and planarizes an upper end of the insulation layer 157.

That is, the light emitting display panel according to the present disclosure may include the substrate 151, the auxiliary cathode electrode 152a included in the substrate 151, the buffer 153 which covers the auxiliary cathode electrode 152a, the pixel driving circuit layer PDL which is provided in the buffer 153 and includes the driving transistor Tdr, the insulation layer 157 which covers the pixel driving circuit layer PDL, the planarization layer 158 which covers the insulation layer 157 and planarizes an upper end of the insulation layer 157, the anode 159c provided on the passivation layer 163 and connected to the driving transistor Tdr, the bank 160 surrounding the outer portion of the anode 159c, the light emitting layer 161 provided on the anode 159c, and the cathode 162 provided on the light emitting layer 161. The cathode 162 may be connected to the auxiliary cathode electrode 152a through a connection electrode 164 exposed at the undercut region K passing through the bank 160, the planarization layer 158, the insulation layer 157, and the buffer 153.

Hereinafter, the elements will be described in detail.

First, the substrate 151 may be a glass substrate or a plastic substrate, but is not limited thereto and may be formed of various kinds of films.

The auxiliary cathode electrode 152a may be provided in the substrate. The auxiliary cathode electrode 152a, as illustrated in FIGS. 1, 3, and 4, may be connected to a cathode pad electrode 159a and may be provided in the substrate 151 in a line shape. The auxiliary cathode electrode 152a may be provided along a data line DL, or may be provided along a gate line GL.

The auxiliary cathode electrode 152a may perform a function of uniformly supplying a cathode voltage, supplied from a power supply included in the light emitting display apparatus, to the pixels included in the light emitting display panel 100.

Therefore, the auxiliary cathode electrode 152a may be provided at each of positions corresponding to all data lines DL, or may be provided at only positions corresponding to some data lines DL.

The auxiliary cathode electrode 152a may be electrically connected to the cathode 162 through the connection line 164 provided in the undercut region K.

That is, the auxiliary cathode electrode 152a may be connected to the cathode 162 through an undercut region K included in all pixels, or may be connected to the cathode 162 through an undercut region K included in some pixels. To provide an additional description, because the auxiliary cathode electrode 152a is included in the light emitting display panel 100 so that the cathode voltage is uniformly supplied to all pixels, the number and arrangement structure of auxiliary cathode electrodes 152a and the positions and number of undercut regions K may be variously changed based on a size and a characteristic of the light emitting display panel 100.

In order to minimize voltage drop caused by a resistance, the auxiliary cathode electrode 152a may include metal such as copper, and moreover, may include metals having high conductivity. Also, depending on the case, the auxiliary cathode electrode 152a may be formed through overlapping of at least two metals. For example, the auxiliary cathode electrode 152a may be formed through overlapping of copper (Cu), molybdenum-titanium alloy (MoTi), and indium tin oxide (ITO).

In addition to the auxiliary cathode electrode 152a, a light blocking layer 152b for blocking light flowing into the driving transistor Tdr may be provided in the substrate 151. The light blocking layer 152b may not be connected to the driving transistor, but as illustrated in FIGS. 3 and 4, may be connected to a first terminal T1 of the driving transistor Tdr.

In addition to the auxiliary cathode electrode 152a and the light blocking layer 152b, various lines may be provided in the substrate 151. The lines included in the substrate 151 may be used as the data line DL, the gate line GL, the sensing line SL, the first voltage supply line PLA, the second voltage supply line PLB, and the sensing control line SCL.

The light blocking layer 152b and the line provided in the substrate 151 may be formed through the same process as the auxiliary cathode electrode 152a. Accordingly, the light blocking layer 152b and the line may be formed of the same material as that of the auxiliary cathode electrode 152a to have the same structure as that of the auxiliary cathode electrode 152a.

Subsequently, the buffer 153 may cover the auxiliary cathode electrode 152a. The buffer 153 may include at least one inorganic layer or at least one organic layer, or may include at least one inorganic layer and at least one organic layer.

For example, the buffer 153 may include silicon dioxide ($SiO_2$)

Subsequently, as illustrated in FIGS. 3 and 4, the pixel driving circuit layer PDL including the driving transistor Tdr may be provided on the buffer 153.

The pixel driving circuit PDC including the driving transistor Tdr may be provided in the pixel driving circuit layer PDL. The pixel driving circuit PDC, as described above with reference to FIG. 2, may include the switching transistor Tsw1, the storage capacitor Cst, the driving transistor Tdr, and the sensing transistor Tsw2.

Moreover, the data line DL, the gate line GL, the sensing control line SCL, the sensing line SL, and the first voltage supply line PLA connected to the pixel driving circuit PDC may be provided in the pixel driving circuit layer PDL.

In this case, in FIGS. 3 and 4, the pixel driving circuit layer PDL including only the driving transistor Tdr is illustrated, but the transistors and the lines described above may be provided in various shapes in the pixel driving circuit layer PDL.

The driving transistor Tdr included in the pixel driving circuit layer PDL may include a semiconductor layer 154c provided on the buffer 153, a first terminal T1 provided on the buffer 153 and connected to one side of the semiconductor layer 154c, a second terminal T2 provided on the buffer 153 and connected to the other side of the semiconductor layer 154c, a gate insulation layer 155d provided on the semiconductor layer 154c, and a gate 156a provided on the gate insulation layer 155d.

The semiconductor layer 154c may include an amorphous silicon semiconductor, a polysilicon semiconductor, or an oxide semiconductor. For example, the semiconductor layer 154c may include an amorphous semiconductor including indium gallium zinc oxide (IGZO).

The gate insulation layer 155d may insulate the semiconductor layer 154c from the gate 156a. The gate insulation layer 155d may include at least one inorganic layer or at least one organic layer, or may include at least one inorganic layer and at least one organic layer.

The gate 156a may include one metal, or may be formed through overlapping of at least two metals. For example, the gate 156a may include Cu and MoTi.

The first terminal T1 may be connected to the anode 159c.

The first terminal T1 may include a first active electrode 154b, provided on the buffer 153 and connected to one side of the semiconductor layer 154c, and a first auxiliary electrode 155b provided on the first active electrode 154b.

The second terminal T2 may include a second active electrode 154d, provided on the buffer 153 and connected to the other side of the semiconductor layer 154c, and a second auxiliary electrode 155c provided on the second active electrode 154d.

The first active electrode 154b and the second active electrode 154d may be formed by injecting an electron or a hole into the same material as that of the semiconductor layer 154c, or may be formed by irradiating ultraviolet light onto the same material as that of the semiconductor layer 154c.

The first auxiliary electrode 155b and the second auxiliary electrode 155c may include various kinds of metals, and for example, may include MoTi.

The anode 159c may be connected to the first auxiliary electrode 155b and the first active electrode 154b.

An auxiliary insulation layer 155e including the same material as that of the gate insulation layer and an auxiliary metal 156b including the same material as that of the gate 156a may be provided between the first auxiliary electrode 155b and the anode 159c.

In this case, the anode 159c may cover the auxiliary metal 156b and the auxiliary insulation layer 155e and may be connected to the first auxiliary electrode 155b.

An auxiliary insulation layer 155f including the same material as that of the gate insulation layer and an auxiliary metal 156c including the same material as that of the gate 156a may be provided between the second auxiliary electrode 155c and the anode 159c.

In this case, the auxiliary metal 156c and the auxiliary insulation layer 155f may be covered by a second terminal electrode 159d, and the second terminal electrode 159d may be connected to the second auxiliary electrode 155c.

Subsequently, the insulation layer 157 may cover the pixel driving circuit layer PDL. The insulation layer 157 may include at least one inorganic layer or at least one organic layer, or may include at least one inorganic layer and at least one organic layer.

For example, the insulation layer 157 may include SiO2.

Subsequently, the planarization layer 158 may cover the insulation layer 157 and may planarize an upper end of the insulation layer 157. The planarization layer 158 may include at least one inorganic layer or at least one organic layer, or may include at least one inorganic layer and at least one organic layer.

Subsequently, the anode 159c may be provided in the planarization layer and may be connected to the driving transistor Tdr. Particularly, the anode 159c may be connected to the first terminal T1 of the driving transistor Tdr.

The anode 159c may be apart from another anode in each of pixels.

The anode 159c may include a transparent electrode such as indium tin oxide (ITO) or indium zinc oxide (IZO), include an opaque electrode such as Cu, or include a transparent electrode and an opaque electrode.

In this case, in addition to the anode 159c, a cathode pad electrode 159a, an auxiliary connection electrode 159b, and a second terminal electrode 159d may be provided on the planarization layer 158. That is, the anode 159c, the cathode pad electrode 159a, the auxiliary connection electrode 159b, and the second terminal electrode 159d may be simultaneously formed through the same process, and thus, may include the same material.

First, the cathode pad electrode 159a may be connected to the auxiliary cathode electrode 152a through a hole passing through the passivation layer 163 (particularly, the planarization layer 158, the insulation layer 157, and the buffer 153).

The cathode pad electrode 159a, illustrated in FIG. 1, may be provided in the non-display area 130 of the light emitting display panel 100 and may be connected to the power supply included in the light emitting display apparatus. That is, the auxiliary cathode electrode 152a may be connected to the cathode pad electrode 159a included in the non-display area 130 of the substrate.

The power supply may be directly provided in the non-display area 130. In a case where the power supply is mounted on the main substrate with the controller 400 mounted thereon, the power supply may be connected to the cathode pad electrode 159a through a line included in a film connecting the main substrate to the light emitting display panel 100.

Second, the auxiliary connection electrode 159b may be covered by the bank 160.

The auxiliary connection electrode 159b may connect the auxiliary cathode electrode 152a to the connection electrode 164.

One side of the auxiliary cathode electrode 152a may be exposed at the undercut region K, and the other side of the auxiliary cathode electrode 152a may be covered by the passivation layer 163. The undercut region K may be formed to pass through the passivation layer 163. Particularly, the undercut region K may pass through the planarization layer 158, the insulation layer 157, and the buffer 153, and thus, the auxiliary cathode electrode 152a may be exposed at the undercut region K. In this case, the undercut region K may pass through the bank 160.

Therefore, in the cross-sectional views illustrated in FIGS. 3 and 4, one side of the auxiliary cathode electrode 152a (for example, a left side of the auxiliary cathode electrode 152a) may be exposed at the undercut region K, and in the cross-sectional views illustrated in FIGS. 3 and 4, the other side of the auxiliary cathode electrode 152a (for example, a right side of the auxiliary cathode electrode 152a) may be covered by the passivation layer 163.

That is, the right side of the auxiliary cathode electrode 152a may be covered by the bank 160, the planarization layer 158, the insulation layer 157, and the buffer 153. The left side of the auxiliary cathode electrode 152a may be exposed at the undercut region K, and the left side of the auxiliary cathode electrode 152a may extend to a pad part Y1 of the non-display area 130 and may be connected to the cathode pad electrode 159a.

In this case, the other side of the auxiliary cathode electrode 152a may be connected to the auxiliary connection electrode 159b provided in the passivation layer 163, and the connection electrode 164 may be connected to the auxiliary connection electrode 159b, in the passivation layer 163.

Therefore, the auxiliary cathode electrode 152a may be connected to the connection electrode 164 by the auxiliary connection electrode 159b.

For example, the other side of the connection electrode 164 may be connected to the auxiliary connection electrode 159b, in the passivation layer 163, and the auxiliary connection electrode 159b may be connected to the auxiliary cathode electrode 152a through an auxiliary connection electrode contact hole M.

That is, the passivation layer 163 may include the buffer 153 which covers the other side of the connection electrode 164, the connection electrode 164 which is provided in the buffer 153 and where one side thereof is exposed at the undercut region, the insulation layer 157 which covers the other side of the connection electrode 164, the planarization layer 158 which covers the insulation layer 157, and the auxiliary connection electrode 159b which is connected to the auxiliary cathode electrode 152a through the auxiliary connection electrode contact hole M passing through the planarization layer and the insulation layer.

The connection electrode 164 may include a first electrode 154a, which is provided on the buffer 153 and includes the same material as that of the semiconductor layer 154c configuring the driving transistor Tdr, and a second electrode 155a which is provided on the first electrode 154a and includes the same material as that of each of the first auxiliary electrode 155b and the second auxiliary electrode 155c. That is, the first electrode 154a may be formed through the same process as the semiconductor layer 154c, and the second electrode 155a may be formed through the same process as the first auxiliary electrode 155b and the second auxiliary electrode 155c.

The second electrode 155a may protrude to the undercut region K, and the first electrode 154a may be provided between the second electrode 155a and the buffer 153.

The cathode 162 may extend to a lower end of the undercut region K along the bank configuring the undercut region K and may be connected to the second electrode 155a which protrudes toward the undercut region K from a portion under the undercut region K. In this case, because the light emitting layer 161 is provided under the cathode 162, the cathode 162 may extend to the lower end of the undercut region K along the light emitting layer 161 provided on the bank, and the cathode 162 and the light emitting layer 161 may be connected to one side of the second electrode 155a. Therefore, the cathode 162 may be electrically connected to the second electrode 155a.

In this case, as described above, the auxiliary connection electrode 159b may be connected to the first electrode 154a and the second electrode 155a which configure the connection electrode 164, and the auxiliary connection electrode 159b may be connected to the auxiliary cathode electrode 152a through the auxiliary connection electrode contact hole M which is provided in the buffer 153, the insulation layer 157, and the planarization layer 158.

Therefore, the cathode 162 extending to the lower end of the undercut region K may be electrically connected to the auxiliary cathode electrode 152a through the connection electrode 164 and the auxiliary connection electrode 159b.

The auxiliary cathode electrode, as described above, may be connected to the cathode pad electrode 159a provided in the non-display area 130 of the substrate 151, and the cathode pad electrode 159a may be connected to the power supply.

Therefore, the cathode voltage supplied from the power supply may be supplied to the cathode 162 through the cathode pad electrode 159a, the auxiliary cathode electrode 152a, the auxiliary connection electrode 159b, and the connection electrode 164.

When the undercut region K is provided in all pixels or is provided two or more pixels, the same cathode voltage may be simultaneously supplied to a plurality of regions of the cathode 162, and thus, the cathode voltage may be uniformly supplied to all of the display area 120 of the light emitting display panel.

In this case, only the auxiliary cathode electrode 152a has been described above as being connected to the cathode pad electrode 159a, but all of the cathode 162 and the auxiliary cathode electrode 152a may be connected to the cathode pad electrode 159a.

Moreover, in FIG. 1, one cathode pad electrode 159a is illustrated, but at least two cathode pad electrodes 159a may be provided in the non-display area 130. In this case, each of the auxiliary cathode electrodes 152a may be connected to one of at least two cathode pad electrodes 159a. Each of the auxiliary cathode electrodes 152a may be connected to the power supply.

Third, the second terminal electrode 159d may be connected to the second terminal T2 of the driving transistor Tdr. That is, the second terminal electrode 159d may be connected to the second active electrode 154d and the second auxiliary electrode 155c, which configure the second terminal T2. The second terminal T2, as illustrated in FIG. 2, may be connected to the first voltage supply line PLA.

As described above, the anode 159c may be electrically connected to the driving transistor Tdr provided in the pixel driving circuit layer PDL and may be patterned in each pixel.

The anode 159c may be one of two electrodes configuring the light emitting device ED. For example, when the light emitting device ED is an organic light emitting diode, the organic light emitting diode may include a first pixel electrode, the light emitting layer 161 provided on the first pixel electrode, and a second pixel electrode provided on the light emitting layer 161. The first pixel electrode may be the anode 159c, and the second pixel electrode may be the cathode 162. In this case, the anode 159c may be connected to the driving transistor Tdr.

That is, the anode 159c provided on the planarization layer 158 may be electrically connected to a transistor (particularly, the driving transistor Tdr) included in the pixel driving circuit layer PDL.

The anode 159c may include a transparent electrode such as ITO or IZO, include an opaque electrode such as Cu, or include a transparent electrode and an opaque electrode.

In a case where the light emitting display panel according to the present disclosure uses a top emission type (i.e., a type where light is emitted in an upward direction of the anode 159c), the anode 159c may include at least one opaque electrode.

In a case where the light emitting display panel according to the present disclosure uses a bottom emission type (i.e., a type where light is emitted in a downward direction of the anode 159c), the anode 159c may include at least one transparent electrode.

Subsequently, the bank 160 may surround the anode 159c. The bank 160 may include at least one inorganic layer or at least one organic layer, or may include at least one inorganic layer and at least one organic layer.

A portion, which is exposed without being surrounded by the bank, of the anode 159c may configure an opening portion Y3 to which light is output. Hereinafter, a region including the undercut region K among a plurality of regions including the bank 160 may be referred to as an undercut portion Y2 (as shown in FIGS. 5 and 6), and a region including the pixel driving circuit PDC including the driving transistor Tdr may be referred to as a blocking portion Y4 (as shown in FIGS. 7 and 8). Also, a region including the cathode pad electrode 159a may be referred to as a pad part Y1.

The pixel 110 of the light emitting display panel 100 according to the present disclosure, as illustrated in FIG. 3, may include the undercut portion Y2, the opening portion Y3, and the blocking portion Y4. In this case, as described above, the undercut portion Y2 may be provided between two adjacent pixels of the plurality of pixels, or may be provided between only some pixels.

Moreover, in a case where the light emitting display panel 100 according to the present disclosure is a transparent panel, as illustrated in FIG. 4, each pixel 110 may include the undercut portion Y2, the opening portion Y3, the blocking portion Y4, and a light transmitting portion Y5. The light transmitting portion Y5 may be a region through which light passes. That is, light flowing in through the cathode 162 on the light transmitting portion Y5 may be transferred to the outside of the light emitting display panel 100 through the substrate 151 under the light transmitting portion Y5, and light flowing in through the substrate 151 under the light transmitting portion Y5 may be transferred to the outside of the light emitting display panel 100 through the cathode 162 on the light transmitting portion Y5.

In the light emitting display panel 100 including the light transmitting portion Y5, the undercut portion Y2 may be provided between two adjacent pixels of the plurality of pixels, or may be provided between only some pixels.

Subsequently, the light emitting layer 161 may be provided on the anode 159c.

The light emitting layer 161 may be divided for each pixel, or may be provided on a whole surface of the substrate 161 to cover the bank 160 and the anodes 161 included in all pixels.

The light emitting layer 161 may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting layer 161 may include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a case where the light emitting layer 161 emits white light, the light emitting layer 161 may include a hole injection layer (HIL)/hole transport layer (HTL), a blue organic layer, an electron injection layer (EIL)/charge generating layer (CGL)/electron transport layer (ETL), a red organic layer, a yellow green organic layer, an electron injection layer (EIL)/charge generating layer (CGL)/electron transport layer (ETL), a blue organic layer, an electron injection layer (EIL)/electron transport layer (ETL), and an organic buffer, which are sequentially stacked on the anode 161.

The light emitting layer 161 may include a plurality of layers having various stack orders, in addition to layers having a stack order as described above.

That is, the light emitting layer 161 may be configured to emit pieces of light having various colors such as red, green, and blue, and moreover, may be configured to emit white light.

In a case where the light emitting layer 161 emits white light, a color filter may be provided under the light emitting layer 161 or on the light emitting layer 161.

For example, the color filter may be provided on the cathode 162, or may be provided under the planarization layer 158. However, the present disclosure is not limited thereto, and the color filter may be provided at various positions.

Finally, the cathode 162 may be provided on the light emitting layer 161.

In a case where light is output to the outside through the cathode 162, the cathode 162 may include a transparent electrode. For example, the cathode 162 may include ITO or IZO.

However, in a case where light is output to the outside through the anode 159c, the cathode 162 may include opaque metal (for example, Cu) so as to reflect light, emitted from the light emitting layer 161, toward the anode 159c.

The anode 159c, the light emitting layer 161, and the cathode 162 may configure the light emitting device ED.

The cathode 162 may be formed in a plate shape on a whole surface of the display area 120. That is, the cathode 162 may be disposed in all pixels in common.

The cathode 162, as described above, may be connected to the auxiliary cathode electrode 152a through the connection electrode 164 exposed at the undercut region K passing through the bank 160, the planarization layer 158, the insulation layer 157, and the buffer 153. In this case, the connection electrode 164 may be connected to the auxiliary cathode electrode 152a through the auxiliary connection electrode 159b.

In a case where the cathode 162 and the light emitting layer 161 are deposited on the whole surface of the display area 120, a material included in each of the cathode 162 and the light emitting layer 161 may be deposited on the undercut region K.

That is, a first material layer 161a including the same material as that of the light emitting layer 161 may be provided on one side of the auxiliary cathode electrode 152a exposed at the undercut region K, and a second material layer 162a including the same material as that of the cathode 162 may be provided on the first material layer 161a.

The second material layer 162a including the same material as that of the cathode 162, as illustrated in FIG. 4, may be apart from the cathode 162 in the undercut region K. Also, the second material layer 162a may be separated from the auxiliary cathode electrode 152a by the first material layer 161a.

Figure 9A:
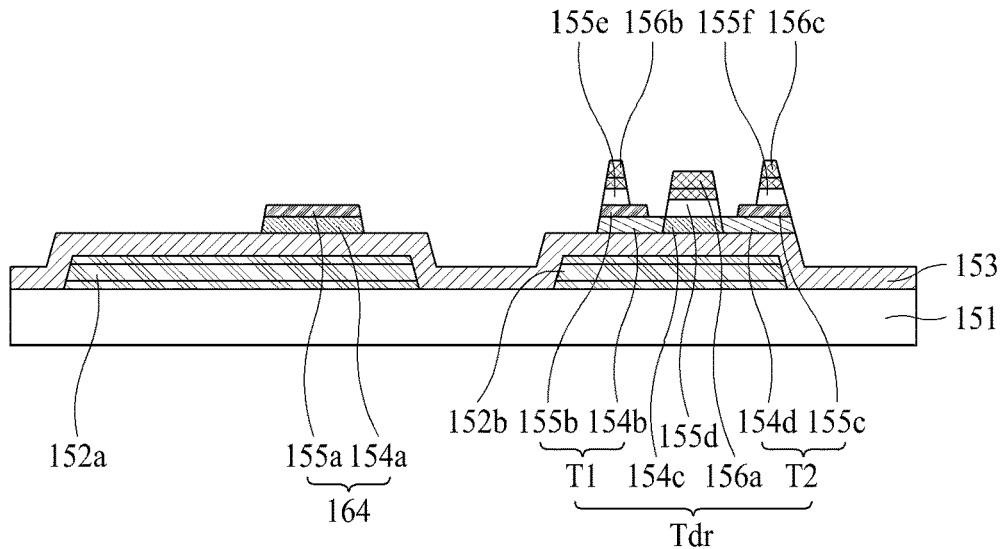
FIGS. 9A to 9J are diagrams for describing a method of manufacturing a light emitting display panel according to an aspect of the present disclosure.
Figure 9B:
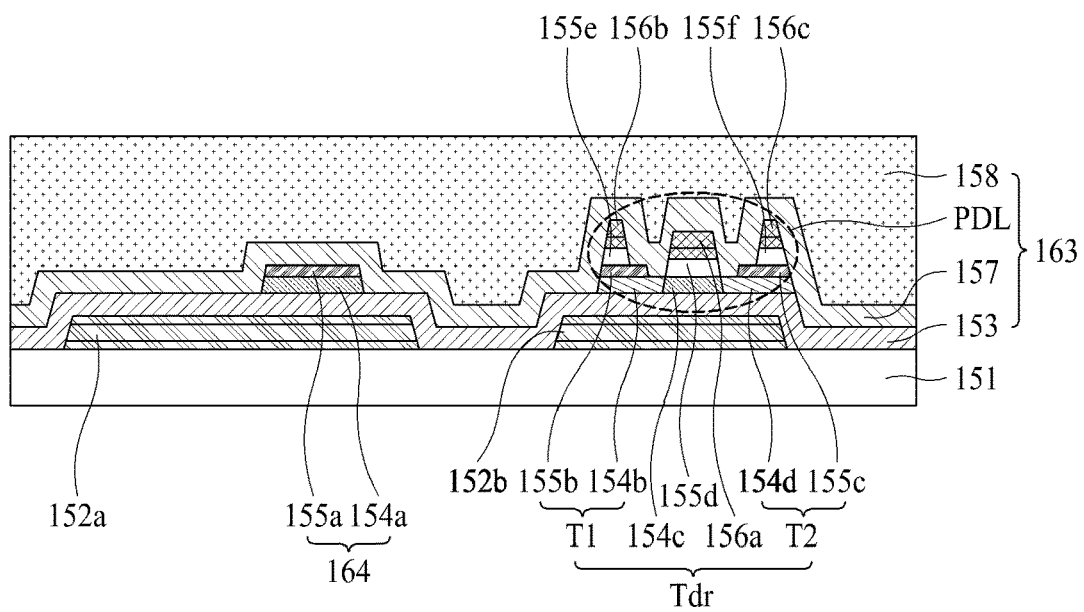
Figure 9C:
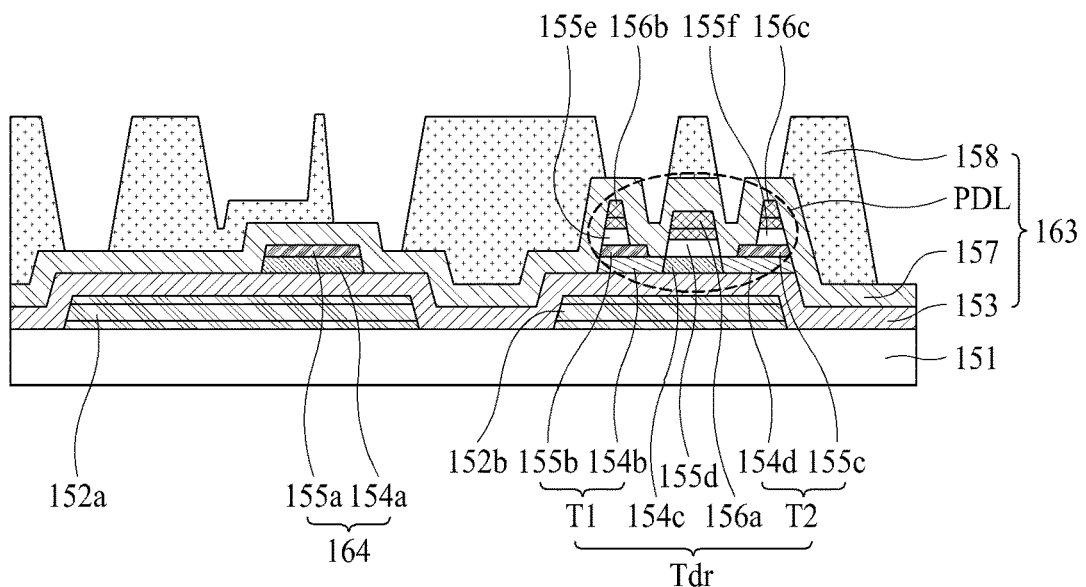
Figure 9D:
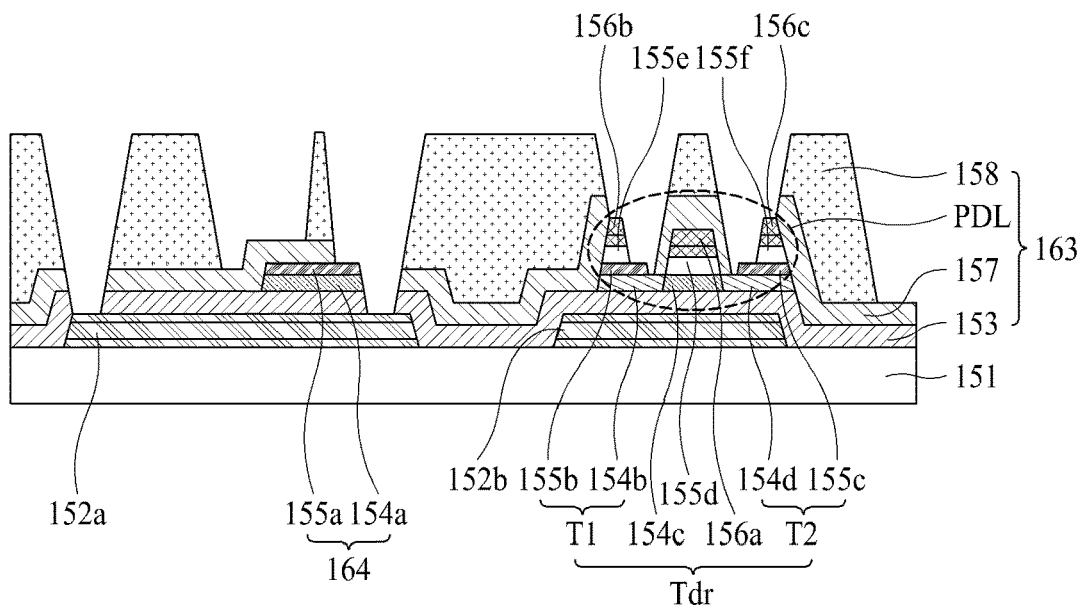
Figure 9E:
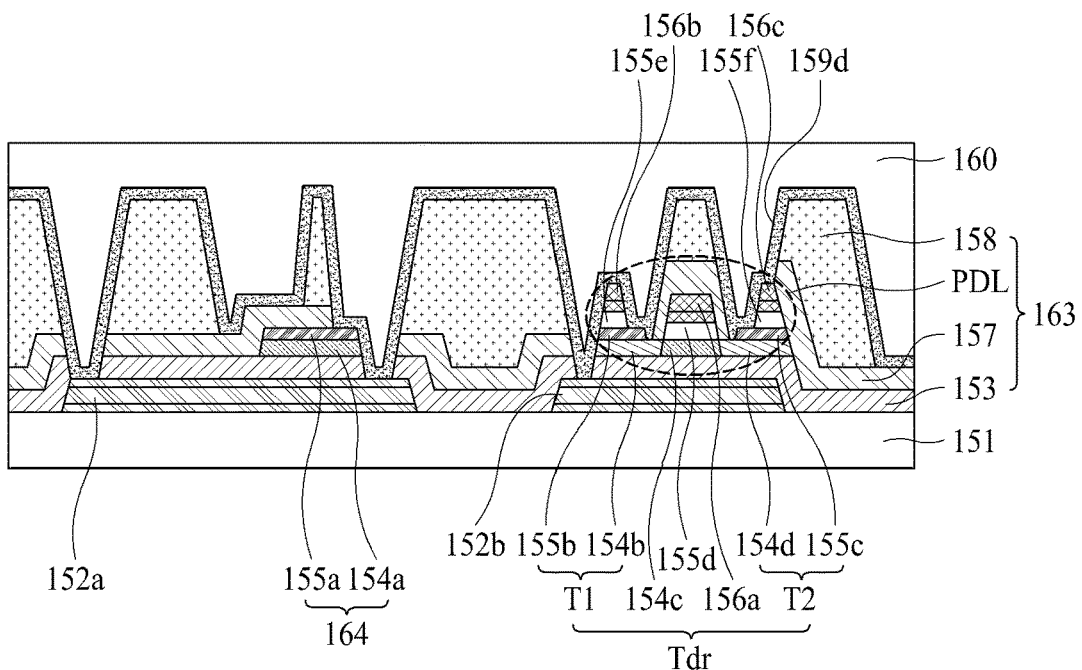
Figure 9F:
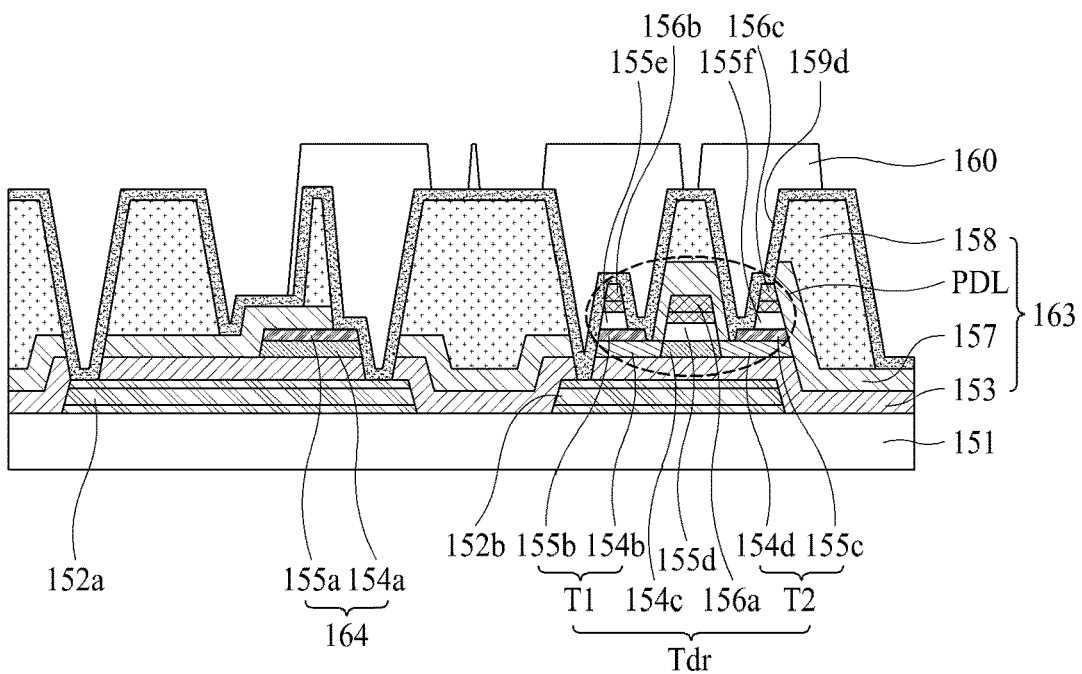
Figure 9G:
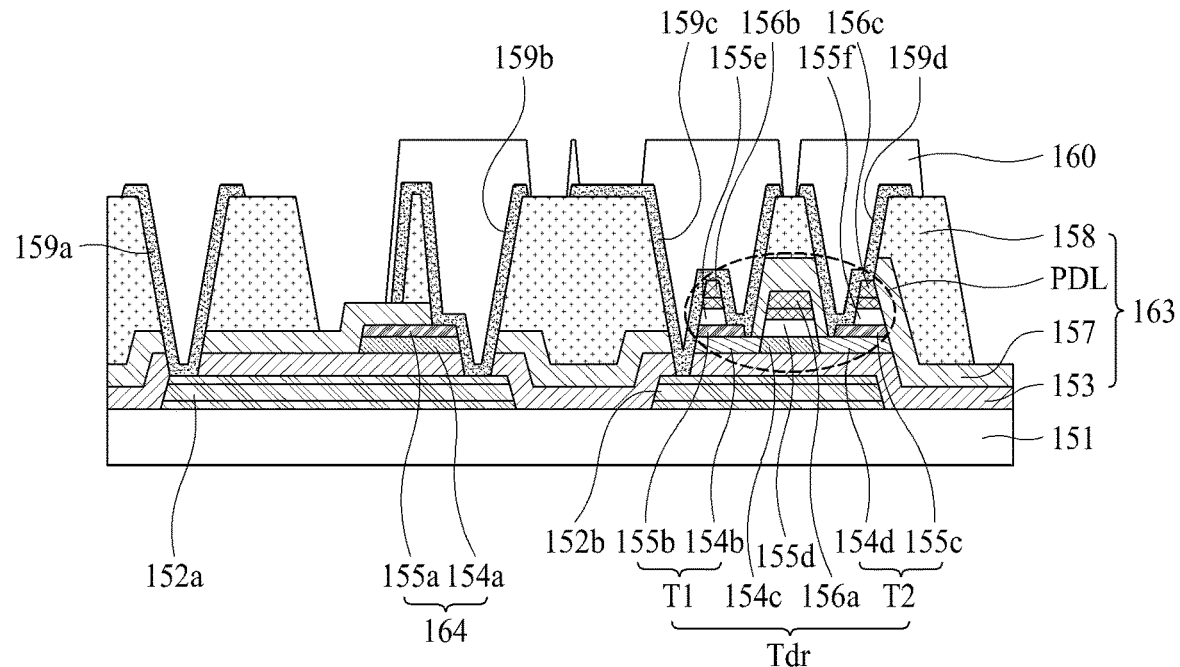
Figure 9H:
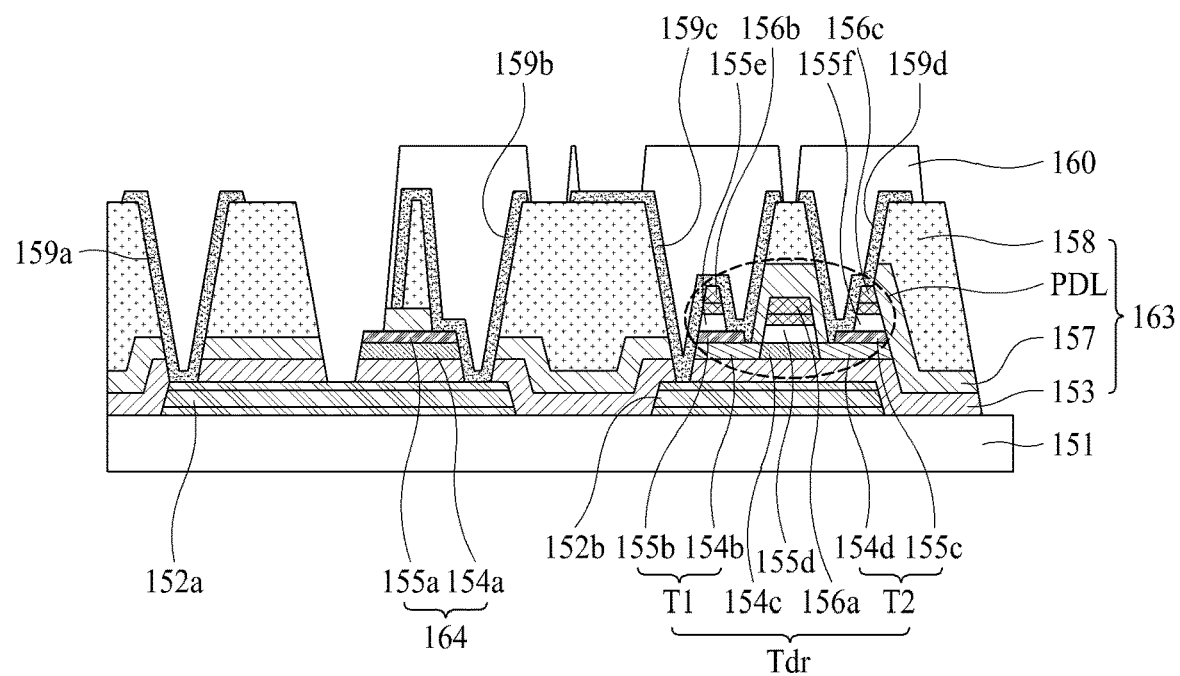
Figure 9I:
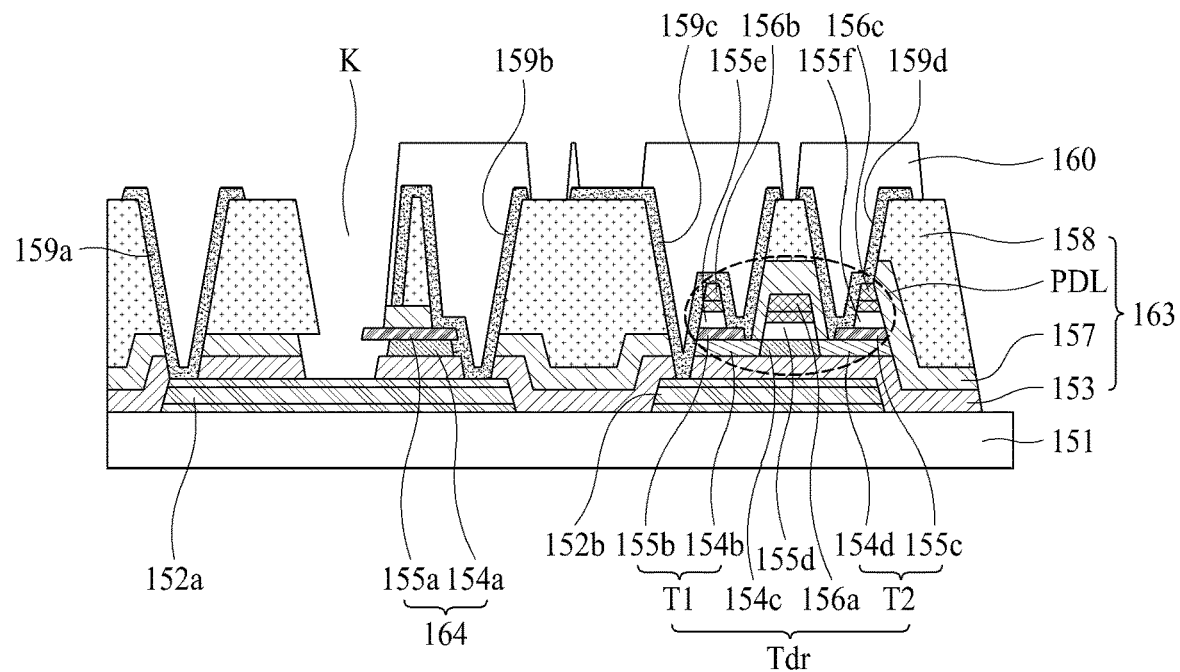
Figure 9J:
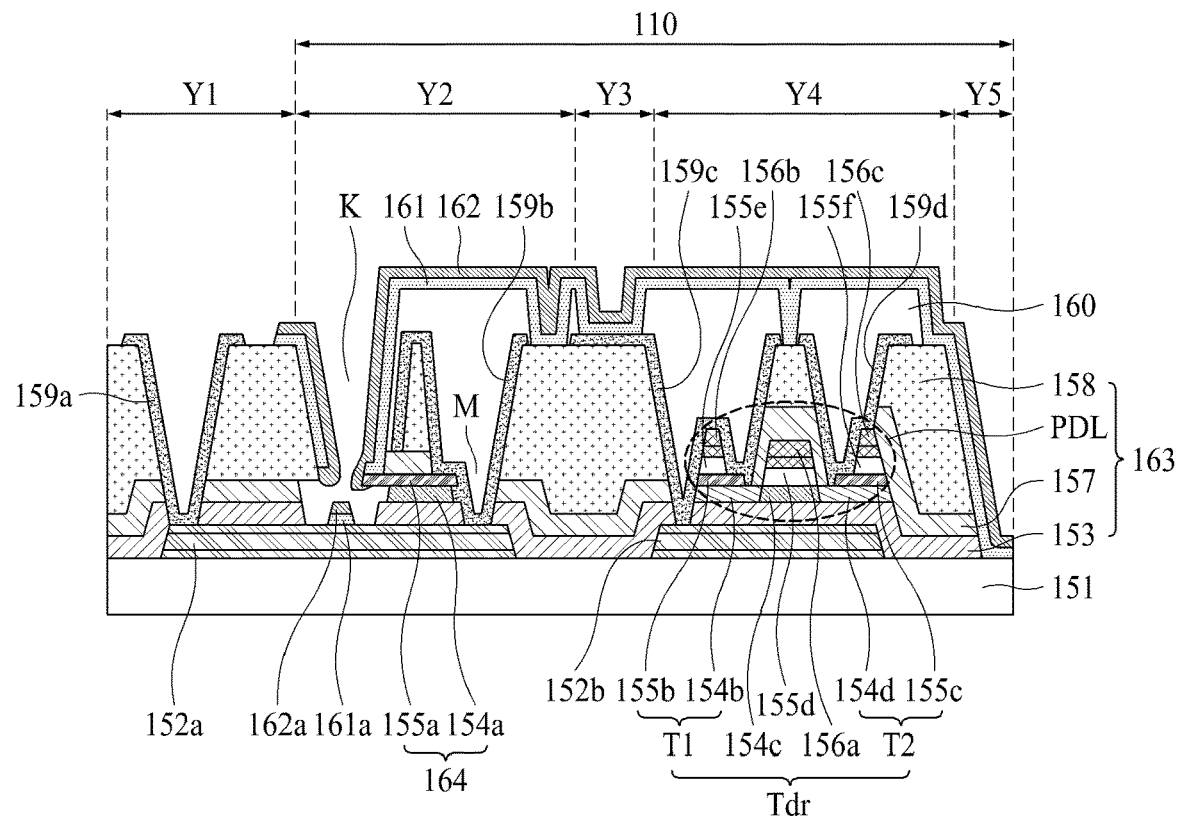
Figure 10:
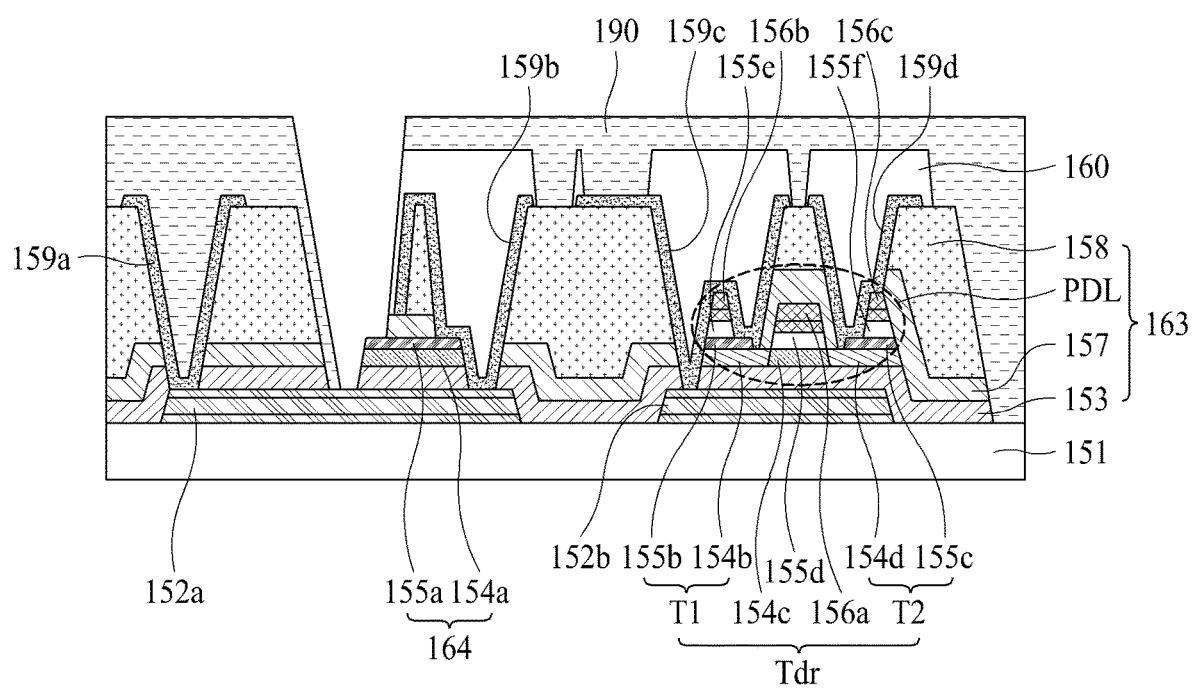
FIG. 10 is another diagram for describing a method of manufacturing a light emitting display panel according to an aspect of the present disclosure.

FIGS. 9A to 9J are diagrams for describing a method of manufacturing a light emitting display panel according to an aspect of the present disclosure, and FIG. 10 is another diagram for describing a method of manufacturing a light emitting display panel according to an aspect of the present disclosure. Particularly, FIGS. 9A to 9J are diagrams for describing a method of manufacturing a light emitting display panel by using eight masks, and FIG. 10 is a diagram for describing a process added to a method of manufacturing a light emitting display panel by using nine masks. In the following description, descriptions which are the same as or similar to descriptions given above with reference to FIGS. 1 to 8 are omitted or will be briefly given.

First, as illustrated in FIG. 9A, the auxiliary cathode electrode 152a and the light blocking layer 152b may be patterned on the substrate 151.

The auxiliary cathode electrode 152a and the light blocking layer 152b may be covered by the buffer 153 deposited on a whole surface of the substrate 151.

The connection electrode 164 and the driving transistor Tdr may be patterned on the buffer 153.

In order to implement the above-described elements, for example, three masks may be used. For example, a first mask for forming the auxiliary cathode electrode 152a and the light blocking layer 152b, a second mask for forming the connection electrode 164, and a third mask for forming the gate 156a may be used.

Subsequently, as illustrated in FIG. 9B, the insulation layer 157 and the planarization layer 158 may be sequentially provided on the connection electrode 164 and the driving transistor Tdr.

For example, various kinds of transistors (for example, the driving transistor Tdr and the signal lines) configuring the pixel driving circuit PDC may be provided in the pixel driving circuit layer PDL. In this case, heights of the various kinds of transistors and the signal lines may differ, and a height of a region including the transistors and the signal lines may differ from that of a region including no transistors or signal lines.

Due to such a height difference, a top surface formed based on transistors and signal lines may not be flat. Accordingly, a top surface of the pixel driving circuit layer PDL may not be flat.

The planarization layer 158 may planarize the top surface of the pixel driving circuit layer PDL which is not flat. That is, the planarization layer 158 may be formed to have a height which is greater than that of the pixel driving circuit layer PDL, and thus, as illustrated in FIG. 9B, a top surface of the planarization layer 158 may be a flat surface.

Subsequently, as illustrated in FIG. 9C, the planarization layer 158 may be patterned. To this end, a mask may be used. In this case, particularly, the planarization layer 158 may be patterned by using a halftone mask.

Subsequently, as illustrated in FIG. 9D, an ashing process and a dry etching process may be performed, and thus, the planarization layer 158 may be further removed and the auxiliary cathode electrode 152a may be exposed through the insulation layer 157 and the buffer 153. That is, a fourth mask may be used for forming a structure illustrated in FIGS. 9C and 9D.

Subsequently, as illustrated in FIG. 9E, an anode electrode for forming the anode may be provided on the whole surface of the display area 120, and the bank 160 may be provided on the anode electrode.

Subsequently, as illustrated in FIG. 9F, the bank 160 may be etched and patterned by using a fifth mask. In this case, a halftone mask may be used.

Moreover, in a process to be described below, sixth to eighth masks may be further used for forming a color filter.

Subsequently, as illustrated in FIG. 9G, the anode electrode may be patterned, and thus, the anode 159c, the cathode pad electrode 159a, the auxiliary connection electrode 159b, and the second terminal electrode 159d may be formed.

After the anode 159c is patterned, a curing process may be performed on the bank 160. Therefore, ends, exposed by the bank 160 patterned between the anode 159c and the second terminal electrode 159d, of the anode 159c and the second terminal electrode 159d may be covered by the bank 160.

Moreover, ends, exposed by the bank 160 patterned between the auxiliary connection electrode 159b and the anode 159c, of the auxiliary connection electrode 159b and the anode 159c may be covered by the bank 160.

Subsequently, as illustrated in FIG. 9H, a dry etching process may be performed on the insulation layer 157 and the buffer 153. Accordingly, one side of the auxiliary cathode electrode 152a may be exposed through the insulation layer 157 and the buffer 153.

Subsequently, as illustrated in FIG. 9I, a wet etching process may be performed on the insulation layer 157 and the buffer 153. Accordingly, the undercut region K may be formed.

Finally, as illustrated in FIG. 9J, the light emitting layer 161 and the cathode 162 may be coated on the whole surface of the display area 120. In this case, the cathode 162 may be connected to the connection electrode 164, in the undercut region K. The connection electrode 164 may be connected to the auxiliary connection electrode 159b, and the auxiliary connection electrode 159b may be connected to the auxiliary cathode electrode 152a through the auxiliary connection electrode contact hole M.

Therefore, the cathode 162 may be connected to the auxiliary cathode electrode 152a, in the undercut region K.

The auxiliary cathode electrode 152a may be connected to the cathode pad electrode 159a provided in the non-display area 130, and the cathode pad electrode 159a may be connected to the power supply.

Therefore, the cathode voltage supplied from the power supply through the cathode pad electrode 159a may be supplied to the cathode 162 through the auxiliary cathode electrode 152a, the auxiliary connection electrode 159b, and the connection electrode 164.

When the undercut region K is provided in a plurality of regions of the display area 120, the same cathode voltage may be simultaneously supplied from the plurality of regions of the display area 120 to the cathode 162.

Therefore, the cathode voltage may be uniformly supplied to all of the display area 120, and thus, the quality of the light emitting display apparatus may be enhanced.

In this case, a cross-sectional surface illustrated in FIG. 9J may be the same cross-sectional surface as a cross-sectional surface illustrated in FIG. 4.

That is, as described above, the light emitting display panel 100 according to the present disclosure having a structure illustrated in FIGS. 4 and 9J may be formed by using eight masks. However, the light emitting display panel 100 according to the present disclosure having the structure illustrated in FIGS. 4 and 9J may also be formed by using nine masks through other processes.

A method of manufacturing the light emitting display panel 100 according to the present disclosure by using nine masks will be described below. In this case, processes described with reference to FIGS. 9A to 9H may be identically applied to a manufacturing method using nine masks, and thus, its description will be briefly given below.

First, as illustrated in FIG. 9A, the auxiliary cathode electrode 152a and the light blocking layer 152b may be patterned on the substrate 151.

Subsequently, as illustrated in FIG. 9B, the insulation layer 157 and the planarization layer 158 may be sequentially provided on the connection electrode 164 and the driving transistor Tdr.

Subsequently, as illustrated in FIG. 9C, the planarization layer 158 may be patterned.

Subsequently, as illustrated in FIG. 9D, an ashing process and a dry etching process may be performed, and thus, the planarization layer 158 may be further removed and the auxiliary cathode electrode 152a may be exposed through the insulation layer 157 and the buffer 153.

Subsequently, as illustrated in FIG. 9E, an anode electrode for forming the anode may be provided on the whole surface of the display area 120, and the bank 160 may be provided on the anode electrode.

Subsequently, as illustrated in FIG. 9F, the bank 160 may be etched and patterned by using a mask. In this case, a halftone mask may be used.

That is, as described above, five masks may be used for manufacturing a shape illustrated in FIG. 9F.

Moreover, in a process to be described below, a sixth mask for forming a shape illustrated in FIG. 10 and seventh to ninth masks for forming a color filter may be further used.

Subsequently, as illustrated in FIG. 9G, the anode electrode may be patterned, and thus, the anode 159c, the cathode pad electrode 159a, the auxiliary connection electrode 159b, and the second terminal electrode 159d may be formed.

Subsequently, as illustrated in FIG. 9H, a dry etching process may be performed on the insulation layer 157 and the buffer 153. Accordingly, one side of the auxiliary cathode electrode 152a may be exposed through the insulation layer 157 and the buffer 153.

Subsequently, as illustrated in FIG. 10, a photoresist 190 may be deposited, and then, may be patterned by a mask.

Subsequently, as illustrated in FIG. 9I, a wet etching process may be performed on the insulation layer 157 and the buffer 153. Accordingly, the undercut region K may be formed.

Finally, as illustrated in FIG. 9J, the light emitting layer 161 and the cathode 162 may be coated on the whole surface of the display area 120.

That is, in a method of manufacturing a light emitting display panel by using nine masks, the cross-sectional view illustrated in FIG. 10 may be further added between the cross-sectional view illustrated in FIG. 9H and the cross-sectional view illustrated in FIG. 9I, and as illustrated in FIG. 10, one mask may be further added for patterning the photoresist 190.

To provide an additional description, in a method of manufacturing a light emitting display panel by using nine masks, as illustrated in FIG. 10, in a state where a portion other than the undercut region K is protected by a photoresist, only the undercut region K may be patterned, and thus, in terms of a process, a method performed by using nine masks may be better than a method performed by using eight masks.

Generally, considering that the number of masks used to manufacture a light emitting display panel is ten or more, the light emitting display panel according to the present disclosure may be manufactured without a large increase in the number of masks, unlike the related art, and moreover, may be manufactured by using fewer masks than the related art.

Therefore, according to the present disclosure, a manufacturing process may be simplified, and the manufacturing cost may be reduced.

According to the aspects of the present disclosure, a resistance of a cathode may be reduced by an auxiliary cathode electrode, and thus, voltage drop may decrease at each position of a light emitting display panel, thereby preventing the quality of the light emitting display panel from being degraded. Also, according to the aspects of the present disclosure, comparing with the related art, an undercut region may be provided in a bank and a planarization layer even without an increase in masks, and thus, a manufacturing process may be simplified and the manufacturing cost may be reduced.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A light emitting display panel comprising:
   a substrate;
   an auxiliary cathode electrode disposed at the substrate;
   a passivation layer covering the auxiliary cathode electrode;
   an anode disposed on the passivation layer;
   a bank surrounding an outer portion of the anode;
   a light emitting layer disposed on the anode; and
   a cathode disposed on the light emitting layer,
   wherein the cathode is connected to the auxiliary cathode electrode through a connection electrode exposed at an undercut region passing through the bank and the passivation layer, and
   wherein the connection electrode has one side overhanging in the undercut region and another side covered by the bank, and
   wherein the one side of the connection electrode is connected to the cathode at the undercut region and the another side of the connection electrode is connected to the auxiliary cathode electrode.

2. The light emitting display panel of claim 1, wherein the auxiliary cathode electrode has one side exposed at the undercut region and another side covered by the passivation layer,
   wherein the another side of the auxiliary cathode electrode is connected to an auxiliary connection electrode disposed at the passivation layer, and the connection electrode is connected to the auxiliary connection electrode at the passivation layer.

3. The light emitting display panel of claim 2, wherein the passivation layer comprises:
   a buffer covering the auxiliary cathode electrode;
   a pixel driving circuit layer disposed at the buffer and including a driving transistor connected to the anode;
   an insulation layer covering the pixel driving circuit layer; and
   a planarization layer covering the insulation layer and planarizing an upper end of the insulation layer.

4. The light emitting display panel of claim 3, wherein the connection electrode comprises:
   a first electrode disposed on the buffer and including a same material as a semiconductor layer constituting the driving transistor; and
   a second electrode disposed on the first electrode.

5. The light emitting display panel of claim 4, wherein the cathode is connected to the second electrode,
   the auxiliary connection electrode is connected to the first electrode and the second electrode, and the auxiliary connection electrode is connected to the auxiliary cathode electrode through an auxiliary connection electrode contact hole in the buffer.

6. The light emitting display panel of claim 2, wherein the passivation layer comprises:
a buffer covering the another side of the auxiliary cathode electrode;
an insulation layer covering the other side of the connection electrode; and
a planarization layer covering the insulation layer,
wherein the connection electrode is disposed at the buffer and has one side of the connection electrode exposed at the undercut region, and
wherein the auxiliary connection electrode is connected to the auxiliary cathode electrode through an auxiliary connection electrode contact hole passing through the planarization layer, the insulation layer and the buffer.

7. The light emitting display panel of claim 6, wherein the auxiliary connection electrode is covered by the bank.

8. The light emitting display panel of claim 1, wherein the auxiliary cathode electrode is connected to a cathode pad electrode disposed at a non-display area of the substrate.

9. The light emitting display panel of claim 1, wherein the auxiliary cathode electrode has one side that is exposed at the undercut region.

10. The light emitting display panel of claim 9, further comprising:
a first material layer disposed on the one side of the auxiliary cathode electrode exposed at the undercut region and including a same material as the light emitting layer; and
a second material layer disposed on the first material layer and including a same material as the cathode.

11. The light emitting display panel of claim 3, wherein the driving transistor comprises:
a semiconductor layer disposed on the buffer;
a first terminal disposed on the buffer and connected to one side of the semiconductor layer;
a second terminal disposed on the buffer and connected to another side of the semiconductor layer;
a gate insulation layer disposed on the semiconductor layer; and
a gate disposed on the gate insulation layer,
wherein the first terminal is connected to the anode.

12. The light emitting display panel of claim 11, wherein the first terminal comprises:
a first active electrode disposed on the buffer and connected to the one side of the semiconductor layer; and
a first auxiliary electrode disposed on the first active electrode.

13. The light emitting display panel of claim 11, wherein the second terminal comprises:
a second active electrode disposed on the buffer and connected to the other side of the semiconductor layer; and
a second auxiliary electrode disposed on the second active electrode,
wherein the anode is connected to the first auxiliary electrode and the first active electrode.

14. The light emitting display panel of claim 12, further comprising an auxiliary insulation layer and an auxiliary metal provided between the first auxiliary electrode and the anode,
wherein the auxiliary insulation layer includes a same material as the gate insulation layer, and the auxiliary metal comprises a same material as the gate.

15. The light emitting display panel of claim 13, wherein the connection electrode comprises:
a first electrode disposed on the buffer and including a same material as the semiconductor layer; and
a second electrode disposed on the first electrode and including a same material as the first auxiliary electrode and the second auxiliary electrode.

16. A light emitting display panel comprising:
a substrate;
an auxiliary cathode electrode disposed at the substrate;
a buffer covering the auxiliary cathode electrode;
a pixel driving circuit layer disposed at the buffer and including a driving transistor;
an insulation layer covering the pixel driving circuit layer;
a planarization layer covering the insulation layer and planarizing an upper end of the insulation layer;
an anode disposed at the planarization layer and connected to the driving transistor;
a bank surrounding an outer portion of the anode;
a light emitting layer disposed on the anode; and
a cathode disposed on the light emitting layer,
wherein the cathode is connected to the auxiliary cathode electrode through a connection electrode exposed at an undercut region passing through the bank, the planarization layer, the insulation layer, and the buffer, and
wherein the connection electrode has one side overhanging in the undercut region and another side covered by the bank, and
wherein the one side of the connection electrode is connected to the cathode at the undercut region and the another side of the connection electrode is connected to the auxiliary cathode electrode.

17. A light emitting display apparatus comprising:
a substrate;
an auxiliary cathode electrode disposed at the substrate;
a passivation layer covering the auxiliary cathode electrode;
an anode disposed on the passivation layer;
a bank surrounding an outer portion of the anode;
a light emitting layer disposed on the anode;
a cathode disposed on the light emitting layer,
a data driver supplying data voltages to a plurality of data lines included in the light emitting display panel;
a gate driver supplying gate voltages to a plurality of gate lines included in the light emitting display panel; and
a controller controlling the data driver and the gate driver,
wherein the cathode is connected to the auxiliary cathode electrode through a connection electrode exposed at an undercut region passing through the bank and the passivation layer, and
wherein the connection electrode has one side overhanging in the undercut region and another side covered by the bank, and
wherein the one side of the connection electrode is connected to the cathode at the undercut region and the another side of the connection electrode is connected to the auxiliary cathode electrode.

\* \* \* \* \*